US008239794B2

(12) United States Patent
Agrawal et al.

(10) Patent No.: US 8,239,794 B2
(45) Date of Patent: Aug. 7, 2012

(54) SYSTEM AND METHOD FOR ESTIMATING LEAKAGE CURRENT OF AN ELECTRONIC CIRCUIT

(75) Inventors: Bhavna Agrawal, Milton, NY (US); David J. Hathaway, Underhill, VT (US); Pravin P. Kamdar, Leander, TX (US); Karl K. Moody, III, Essex Junction, VT (US); Peng Peng, Essex Junction, VT (US); David W. Winston, Asheville, NC (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 12/568,985

(22) Filed: Sep. 29, 2009

(65) Prior Publication Data

US 2011/0077882 A1  Mar. 31, 2011

(51) Int. Cl.
   *G06F 17/50* (2006.01)
   *G06F 17/10* (2006.01)
(52) U.S. Cl. ........ 716/106; 716/104; 716/105; 716/108; 716/111; 716/115; 716/120; 716/136; 703/2; 703/13; 703/14
(58) Field of Classification Search .................. 716/104, 716/105, 106, 108, 111, 115, 120, 136
   See application file for complete search history.

(56) References Cited

U.S. PATENT DOCUMENTS

| | | | |
|---|---|---|---|
| 4,763,289 A * | 8/1988 | Barzilai et al. ..................... 703/2 |
| 5,734,798 A * | 3/1998 | Allred ............................. 706/47 |
| 6,180,957 B1 | 1/2001 | Miyasaka et al. |
| 6,345,379 B1 * | 2/2002 | Khouja et al. ................. 716/115 |
| 6,711,719 B2 * | 3/2004 | Cohn et al. ..................... 716/104 |
| 6,872,991 B1 | 3/2005 | Ngo et al. |
| 7,046,063 B2 | 5/2006 | Kuang et al. |
| 7,266,707 B2 | 9/2007 | Ngo et al. |
| 7,673,260 B2 * | 3/2010 | Chen et al. ..................... 716/106 |
| 7,689,951 B2 * | 3/2010 | Cazeaux ....................... 716/106 |
| 7,694,251 B2 * | 4/2010 | Chandramouli et al. ..... 716/106 |

(Continued)

OTHER PUBLICATIONS

Gulati et al.; "A probabilistic method to determine the minimum leakage vector for combinational designs"; Publication Year: 2006; Circuits and Systems, 2006. ISCAS 2006. Proceedings. 2006 IEEE International Symposium on; p. 4 pp. 2244.*

(Continued)

*Primary Examiner* — Helen Rossoshek
(74) *Attorney, Agent, or Firm* — Gibb & Riley, LLC

(57) ABSTRACT

Disclosed are embodiments of a system and of an associated method for estimating the leakage current of an electronic circuit. The embodiments analyze a layout of an electronic circuit in order to identify all driven and non-driven nets within the electronic circuit, to identify all of the driven net-bounded partitions within the electronic circuit (based on the driven and non-driven nets), and to identify, for each driven net-bounded partition, all possible states of the electronic circuit that can leak. Then, using this information, the embodiments estimate the leakage current of the electronic circuit. This is accomplished by first determining, for each state of each driven net-bounded partition, a leakage current of the driven net-bounded partition and a probability that the state will occur in the driven net-bounded partition during operation of the electronic circuit. Then, for each state of each driven net-bounded partition, the leakage current of the driven net-bounded partition and the state probability are multiplied together. The results are then aggregated.

22 Claims, 6 Drawing Sheets

U.S. PATENT DOCUMENTS

| | | | |
|---|---|---|---|
| 8,004,316 B2* | 8/2011 | Fish et al. | 326/121 |
| 8,024,674 B2* | 9/2011 | Arimoto | 716/51 |
| 8,051,403 B2* | 11/2011 | Nozuyama et al. | 716/136 |
| 8,060,852 B1* | 11/2011 | Varma et al. | 716/136 |
| 8,086,977 B2* | 12/2011 | Law et al. | 716/108 |
| 2007/0106966 A1* | 5/2007 | Inoue et al. | 716/4 |

OTHER PUBLICATIONS

Kulkarni et al.; "A 160 mV Robust Schmitt Trigger Based Subthreshold SRAM"; Publication Year: 2007; Solid-State Circuits, IEEE Journal of; vol. 42, Issue: 10; pp. 2303-2313.*

Lee et al.; "Runtime Leakage Minimization Through Probability-Aware Optimization"; Publication Year: 2006; Very Large Scale Integration (VLSI) Systems, IEEE Transactions on; vol. 14, Issue: 10; pp. 1075-1088.*

Lee et al., "Analysis and Minimization Techniques for Total Leakage Considering Gate Oxide Leakage", University of Michigan, Ann Arbor, MI, 2003, pp. 175-180.

Terauchi et al., "Analysis of Floating-Body-Induced Leakage Current in 0.15 um SOI DRAM", Proceedings of IEEE International SOI Conference, Oct. 1996, pp. 138-139.

Rahman et al., "A Leakage Estimation and Reduction Technique for Scaled CMOS Logic Circuits Considering Gate-Leakage", Center for Low Power Electronics, Department of Electrical Engineering, Arizona State University, IEEE 2004, pp. 297-300.

Oliver et al., "An Evaluation of the Impact of Gate Oxide Tunneling on Dual Vt-Based Leakage Reduction Techniques", Proceedings of the 16th ACM Great Lakes Symposium on VLSI, 2006, pp. 105-110.

Chang et al., "Full-Chip Analysis of Leakage Power Under Process Variations, Including Spatial Correlations", Annual ACM IEEE Design Automation Conference, Proceedings of the 42nd Annual Design Automation Conference, 2005, pp. 523-528.

Sathanur et al., "Multiple Power-Gating Domain (Multi-VGND) Architecture for Improved Leakage Power Reduction", International Symposium on Low Power Electronics and Design, Proceeding of the 13th International Symposium on Low Power Electronics and Design, 2008, pp. 51-56.

Anis et al., "Dynamic and Leakage Power Reduction in MTCMOS Circuits Using an Automated Efficient Gate Clustering Technique", Annual ACM IEEE Design automation Conference, Proceedings of the 39th Annual DEsign Automation Conference, 2002, pp. 480-485.

Anis et al., "Design and Optimization of Multi-Threshold CMOS (MTCMOS) Circuits", Computer-Aided Design of Integrated Circuits and Systems, IEEE Transactions, 2003, pp. 1324-1342.

Acar et al., "Leakage and Leakage Sensitivity Computation for Combinatorial Circuits", IBM Research, Austin, TX, Aug. 2003, pp. 96-99.

* cited by examiner

SYSTEM AND METHOD FOR ESTIMATING LEAKAGE CURRENT OF AN ELECTRONIC CIRCUIT

BACKGROUND

1. Field of the Invention

The embodiments of the invention generally relate to estimating the leakage current of an electronic circuit and, more specifically, to a system and method for estimating the leakage current of an electronic circuit based on leakage current calculations for driven net-bounded partitions of the electronic circuit.

2. Description of the Related Art

Technology scaling causes a reduction in device channel length and gate dielectric thickness and allows for a corresponding increase in device density in modern electronic circuits (i.e., an increase in the number of devices that can be incorporated into a same size chip). Such an increase in device density and reduction in channel length and gate dielectric thickness translates into a corresponding increase in leakage current. Such an increase in leakage current in turn translates into a corresponding increase in power consumption. Consequently, the ability to estimate the leakage current of an electronic circuit and, more particularly, of an electronic circuit having a relatively high device density, has become more and more important. Unfortunately, known techniques for estimating leakage current may not be sufficiently economical or accurate. Therefore, there is a need in the art for improved techniques for estimating the leakage current of an electronic circuit.

SUMMARY

In view of the foregoing, disclosed herein are embodiments of a system and of an associated method for accurately and economically estimating the leakage current of an electronic circuit that comprises multiple devices interconnected by multiple nets, including driven and non-driven nets. The embodiments analyze a layout of an electronic circuit in order to: (1) identify all driven and non-driven nets within the electronic circuit; (2) identify, based on the driven and non-driven nets, all driven net-bounded partitions within the electronic circuit; and (3) identify, for each driven net-bounded partition, all possible states of the electronic circuit that can leak. Then, using this information, the embodiments estimate the leakage current of the electronic circuit. This is accomplished by first determining, for each state of each driven net-bounded partition, a leakage current of the driven net-bounded partition and a probability that the state will occur in the driven net-bounded partition during operation of the electronic circuit. Then, for each state of each driven net-bounded partition, the leakage current of the driven net-bounded partition and the probability are multiplied together. The results are then aggregated (i.e., added together) such that the final sum equals the estimated leakage current for the electronic circuit.

More particularly, disclosed herein are embodiments of a system for estimating the leakage current (e.g., either channel leakage current only or gate and channel leakage current combined) of an electronic circuit that comprises multiple devices interconnected by multiple nets, including driven and non-driven nets. The system embodiments can comprise at least a circuit layout analyzer and a processor in communication with the circuit layout analyzer.

The analyzer can analyze the layout of the electronic circuit design in order to: (1) identify all driven and non-driven nets within the electronic circuit; (2) identify, based on the driven and non-driven nets, all of the driven net-bounded partitions in the electronic circuit; and (3) identify, for each driven net-bounded partition, all possible states of the electronic circuit that can leak.

Specifically, the analyzer can identify the nets in the electronic circuit and can distinguish the driven nets from non-driven nets, driven nets being any net that is driven to a supply voltage in all states of the electronic circuit. Furthermore, the analyzer can identify the driven net-bounded partitions in the electronic circuit as any set of one or more of the multiple devices in the electronic circuit, where the set is configured such that all external connections of the set are among the driven nets and further such that an interconnection between any pair of devices in the set comprises non-driven nets (i.e., at least one non-driven net) and no driven nets. Additionally, at least one of these driven net-bounded partitions in the electronic circuit can comprise multiple field effect transistors that are not configured as a complete logic gate.

Then, based on the information identified by the analyzer, the processor can estimate the leakage current of the electronic circuit. To do this, the processor must first determine, for each state of each driven net-bounded partition, a leakage current of the driven net-bounded partition and a probability that the state will occur in the driven net-bounded partition during operation of the electronic circuit. It should be noted that, while the leakage current of each identified driven net-bounded partition can be separately and individually determined by the processor, the leakage current of a given driven net-bounded partition can, alternatively, be determined simply by reusing a previously determined leakage current for the same state in an identically configured driven net-bounded partition. After determining, for each state of each driven net-bounded partition, the leakage current of the driven net-bounded partition and the probability, the processor can multiply these values together. That is, for each state of each driven net-bounded partition, the processor can multiply the determined leakage current of the driven net-bounded partition times the determined probability that the given state will occur. Finally, the processor can aggregate (i.e., add together) all results of the multiplying process. The final sum will equal the estimated leakage current for the electronic circuit.

Also disclosed herein are embodiments of an associated method for estimating the leakage current of an electronic circuit that comprises multiple devices interconnected by multiple nets, including driven and non-driven nets. The method embodiments can comprise analyzing, by a circuit layout analyzer, the layout of the electronic circuit design in order to: (1) identify all driven and non-driven nets within the electronic circuit; (2) identify, based on the driven and non-driven nets, all driven net-bounded partitions within the electronic circuit; and (3) identify, for each driven net-bounded partitions, all possible states of the electronic circuit that can leak.

During this analyzing process the nets in the electronic circuit can be identified and the driven nets can be distinguished from non-driven nets, the driven nets being any net that is driven to a supply voltage in all states of the electronic circuit. Furthermore, each driven net-bounded partition can be identified as any set of one or more of the multiple devices in the electronic circuit, where the set is configured such that all external connections of the set are among the driven nets and further such that an interconnection between any pair of devices in the set comprises non-driven nets (i.e., at least one non-driven net) and no driven nets. Additionally, at least one of these driven net-bounded partitions in the electronic circuit can comprise multiple field effect transistors that are not configured as a complete logic gate.

The method embodiments can further comprise estimating the leakage current of the electronic circuit. This estimating process can be performed, for example, by a processor in communication with the circuit layout analyzer and can be based on the information identified by the analyzer. Specifically, this estimating process can comprise first determining, for each state of each driven net-bounded partition, a leakage current of the driven net-bounded partition and a probability that the state will occur in the driven net-bounded partition during operation of the electronic circuit. It should be noted that, while the leakage current of each identified driven net-bounded partition can be separately and individually determined by the processor, the leakage current of a given driven net-bounded partition can, alternatively, be determined simply by reusing a previously determined leakage current for the same state in an identically configured driven net-bounded partition. Next, the estimating process can comprise multiplying, for each state of each driven net-bounded partition, the determined leakage current of the driven net-bounded partition times the determined probability that the state will occur and, then, aggregating (i.e., adding together) the results of the multiplying process. The final sum of the aggregating process equals the estimated leakage current for the electronic circuit.

Also disclosed herein are embodiments of a computer program product comprising a storage medium readable by a computer and having computer usable program code embodied thereon. The computer useable program code is executable by the computer to perform the above-described method of estimating the overall leakage current of an electronic circuit.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
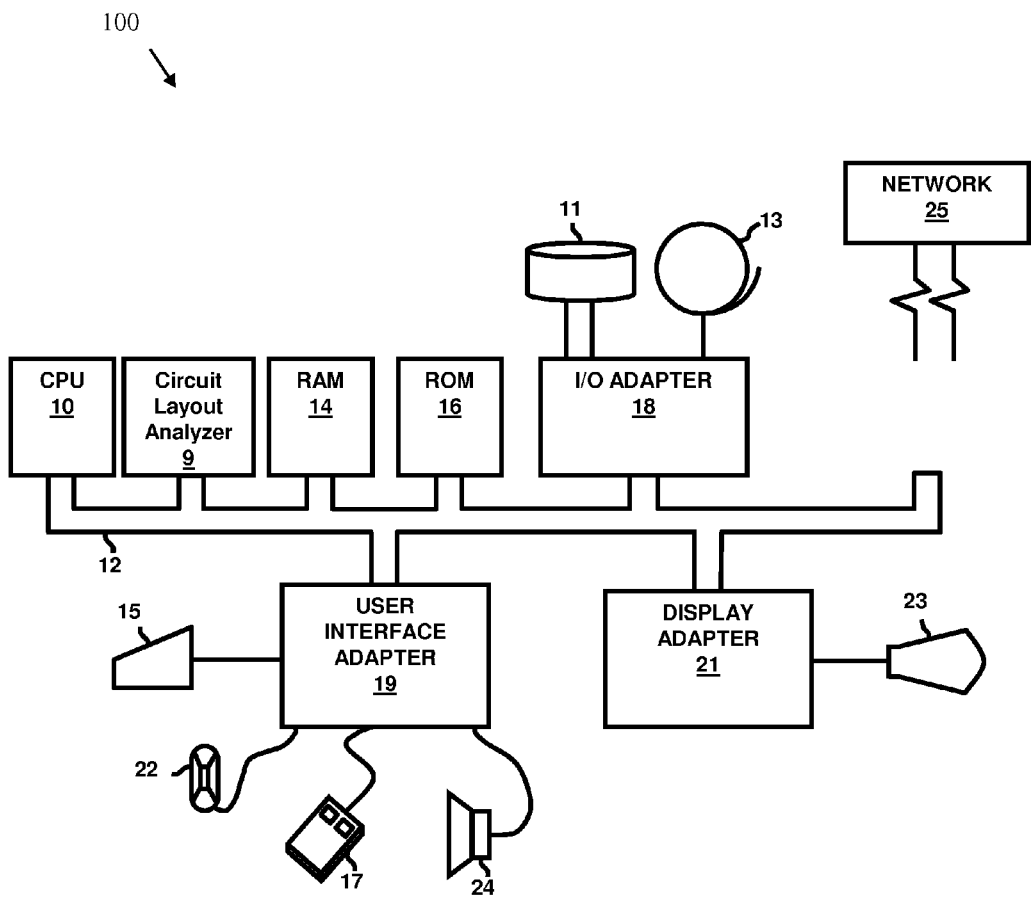
FIG. 1 is a schematic diagram illustrating an embodiment of a system for estimating overall leakage current of an electronic circuit.

The embodiments of the invention and the various features and advantageous details thereof are explained more fully with reference to the non-limiting embodiments that are illustrated in the accompanying drawings and detailed in the following description.

As mentioned above, technology scaling causes a reduction in device channel length and gate dielectric thickness and allows for a corresponding increase in device density in modern electronic circuits (i.e., an increase in the number of devices that can be incorporated into a same size chip). Such an increase in device density and reduction in channel length and gate dielectric thickness translates into a corresponding increase in leakage current. Such an increase in leakage current in turn translates into a corresponding increase in power consumption. Consequently, the ability to estimate the leakage current of an electronic circuit and, more particularly, of an electronic circuit having a relatively high device density, has become more and more important. Unfortunately, known techniques for estimating leakage current may not be sufficiently economical or accurate.

Specifically, one known method of estimating leakage current of an electronic circuit involves circuit simulation of a library cell over all (or a selected subset of) states and determining the leakage in each. This method has two drawbacks. First, the number of inputs to the library cell may be large, and hence the number of states to be characterized may be very large (i.e., an exponential in the number of inputs). Second, circuit simulation may have difficulty accounting for statistical variation in the leakage, which can cause the average leakage to be significantly higher than the leakage of the average $V_T$ (threshold voltage) transistor. Another known method of estimating the leakage current of an electronic circuit involves determining the total number of transistors in an electronic circuit design and, then, determining the probability that each is off, to get a leakage probability-weighted sum of leaking transistor width. This method has the drawback of not properly accounting for leakage through stacked transistors. Thus, there is a need in the art for an improved method of estimating the overall leakage current of an electronic circuit (i.e., a method of characterizing leakage) and, more particularly, a leakage characterization method that does not rely on simulation or analysis of all states of a library cell, but still accounts properly for leakage of stacked transistors.

In view of the foregoing, disclosed herein are embodiments of a system and of an associated method for accurately and economically estimating the leakage current of an electronic circuit that comprises multiple devices interconnected by multiple nets, including driven and non-driven nets. The embodiments analyze the layout of an electronic circuit in order to: (1) identify all driven and non-driven nets within the electronic circuit; (2) identify, based on the driven and non-driven nets, all driven net-bounded partitions within the electronic circuit; and (3) identify, for each driven net-bounded partition, all possible states of the electronic circuit that can leak. Then, using this information, the embodiments estimate the leakage current of the electronic circuit. This is accomplished by first determining, for each state of each driven net-bounded partition, a leakage current of the driven net-bounded partition and a probability that the state will occur in the driven net-bounded partition during operation of the electronic circuit. Then, for each state of each driven net-bounded partition, the leakage current of the driven net-bounded partition and the probability that the state will occur are multiplied together. The results are then aggregated (i.e., added together) with the final sum equaling the estimated leakage current of the electronic circuit.

More particularly, referring to FIG. 1, disclosed herein are embodiments of a system 100 for estimating the leakage current (i.e., either channel leakage current only or gate and channel leakage current combined) of an electronic circuit comprising multiple devices interconnected by multiple nets (i.e., nets of wiring), including driven and non-driven nets. The system 100 can comprise a circuit layout analyzer 9 and a processor 10. The circuit layout analyzer 9 and the processor 10 can, for example, comprise as discrete components incorporated into a single computer system (e.g., a desktop computer, a laptop computer, a dedicated server, etc.), as illustrated. In such a computer system, the analyzer 9 and processor 10 can be interconnected via a system bus 12 to various other system 100 components (e.g., to a random access memory (RAM) 14, a read-only memory (ROM) 16, data storage units 11, 13 via a I/O adapter 18, user interface devices 15, 17, 22, 24 via a user interface adapter 19, a data processing network 25, a display 23 via a display adapter 21, a network 25, etc, the details of which are omitted to allow the reader to focus on the salient aspects of the embodiments described herein). However, it should be understood that the analyzer 9 and processor 10 can, alternatively, comprise a single component within the computer system or can comprise discrete components incorporated into discrete computer systems.

The circuit layout analyzer 9 can analyze (i.e., can be adapt to, configured to, programmed to, etc. analyze) the layout of the electronic circuit design in order to: (1) identify all driven and non-driven nets within the electronic circuit; (2) identify, based on the driven and non-driven nets, all driven net-bounded partitions within the electronic circuit, and (3) identify, for each driven net-bounded partition, all possible states of the electronic circuit that can leak.

Specifically, the analyzer 9 can analyze the layout of the electronic circuit to identify all nets in the electronic circuit and can distinguish the driven nets from non-driven nets, driven nets being any net that is fully driven to a supply voltage (i.e., the negative supply voltage ($V_{SS}$) or the positive supply voltage ($V_{DD}$)), with no threshold voltage drop, in all states of the electronic circuit. Thus, for a net to be driven, either a path to the negative supply voltage ($V_{SS}$) exist through the channel connections of n-type field effect transistors (NFETs) that are all turned on (have high gate voltages) or a path to the positive supply voltage ($V_{DD}$) exist through the channel connections of p-type field effect transistors (PFETs) that are all turned on (have low gate voltages) in all states of the circuit.

Figure 2:
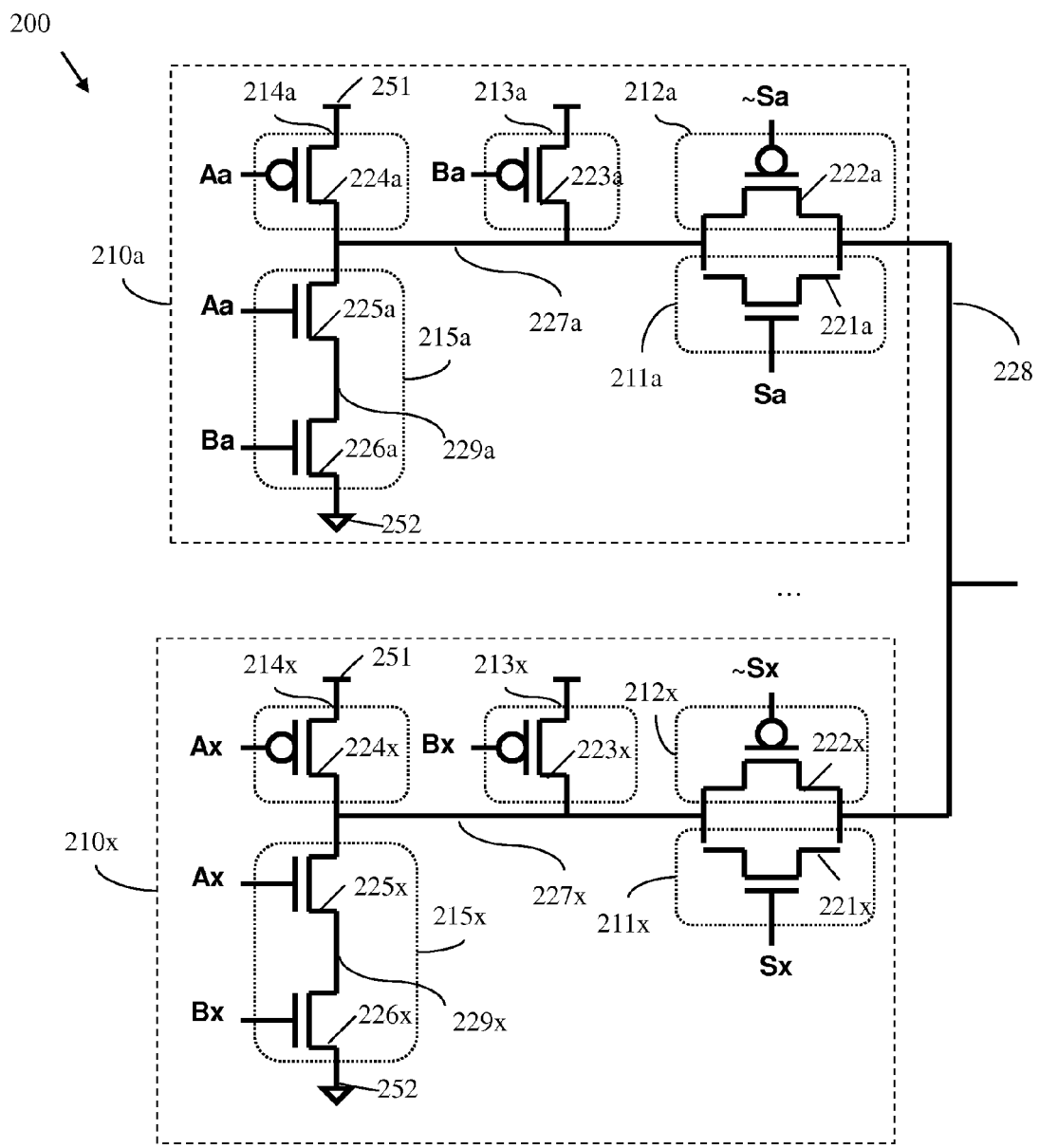
FIG. 2 is a schematic diagram illustrating a portion of an electronic circuit divided into driven net-bounded partitions.

FIG. 2 is a schematic diagram illustrating a single channel connected component (CCC) 200 in a single net in the layout of an electronic circuit. A CCC is a collection of devices (e.g., 221a-226a in section 210a and 221x-226x in section 210x) that are connected to each other by paths through their channel (source and drain) connections, the paths not including the power supply nets ($V_{SS}$ 251 and $V_{DD}$ 252). CCC 200 is illustrated as having x number of duplicate sections (e.g., see sections 210a . . . 210x). Gate signals with identical names, such as the gate signal Aa of devices 224a and 225a, are connected, even though no connecting wire is illustrated.

Referring to FIG. 2 in combination with FIG. 1, in order to identify each driven and non-driven net and, based on the driven and non-driven nets, each driven net-bounded partition 211a-215a . . . 211x-215x within CCC 200, the analyzer 9 can perform a logical analysis on the transistor network of the electronic circuit. The analyzer 9 can use known circuit analysis means to find a logical function (e.g., represented as a BDD, or binary decision diagram) for each net in the circuit, either in terms of primary inputs or more local inputs (e.g., inputs to each channel connected component 200 (CCC)). Then, the analyzer 9 can find all paths from a net to a negative supply voltage ($V_{SS}$) through NFET channels (e.g., see NFETs 221a, 225a, 226a in duplicate section 210a and NFETs 221x, 225x, 226x in duplicate section 210x), and the "driven to zero" function for the net is then the OR over these paths of the AND of the NFET gate functions in each path. In a similar manner, the analyzer 9 can compute a "driven to one" function for the net by examining all paths from to the net from a positive supply voltage ($V_{DD}$) through PFET channels (see PFETs 222a-224a of duplicate section 210a, and PFETs 222x-224x in duplicate section 210x). The net is driven if these function are complements of each other, i.e., if "driven to zero"=NOT "driven to one". For example, the "driven to zero" function of net 227a is (Aa AND Ba), and its "driven to one" function is ((NOT Aa) OR (NOT Ba)). These are complements of each other, and so net 227a is identified as a driven net, and in a like manner, net 227x is identified as a driven net. Additional logical constraints may be used in identifying driven nets. For example, in the example of FIG. 2, signals Sa-Sx are determined (e.g., by designer assertion or analysis of the gates generating them) to be "one hot," meaning that one and only one of them will be high (one) at any time. From this, and the fact that nets 227a of section 210a and 227x of section 210x were determined to be driven, net 228 can be determined to be driven, but nets 229a and 229x can be non-driven.

Determining the driven net-bounded partitions, given these identified driven and non-driven nets, is then relatively simple. Specifically, the analyzer 9 can identify the driven net-bounded partitions in the electronic circuit as any set of one or more of the multiple devices in the electronic circuit, where the set is configured such that all external connections of the set are among the driven nets and further such that an interconnection between any pair of devices in the set comprises non-driven nets (i.e., at least one non-driven net) and no driven nets (see partitions 211a-215a, 211x-215x). That is, multiple transistors are in the same driven net-bounded partition, if there is an interconnection between them that does not include a driven net (e.g., see NFETs 225a-226a which form driven net-bounded partition 215a and NFETs 225x-226x which form driven net-bounded partition 215x). All of the other driven net-bounded partitions illustrated in FIG. 2 include only a single transistor (e.g., see driven net-bounded partition 211a-214a in section 210a and 211x-214x in section 210x). The driven net-bounded partitions in the illustrative example of FIG. 2 each comprises only NFETs (215a, 211a, 215x, and 211x) or only PFETs (212a, 213a, 214a, 212x, 213x, and 214x), but driven net-bounded partitions may in practice comprise any mix of NFETs and PFETs. Additionally, at least one of these driven net-bounded partitions (e.g., 215a, 215x) in the electronic circuit can comprise multiple field effect transistors (e.g., 225a-226a, 225x-226x) that are not configured as a complete logic gate.

As mentioned above, in addition to identifying the driven and non-driven nets in CCC 200 and, based on those driven and non-driven nets, the driven net-bounded partitions 211a-215a, 211x-215x within CCC 200, the analyzer 9 can also identify, for each one of the previously identified driven net-bounded partitions 211a-215a, 211x-215x, all possible states that can leak (i.e., all possible combinations of voltage values at the driven net-bounded partitions external connections). See detailed discussion below regarding how such states are determined.

Then, based on this information, the processor 10 can estimate (i.e., can be adapt to, configured to, programmed to, etc. estimate) the leakage current of the electronic circuit. In devices produced by some semiconductor processes, gate leakage currents may be negligible in comparison with channel leakage currents. Depending upon the embodiment, this estimated "leakage current" can therefore comprise either the sum of gate and channel leakage currents for the entire electronic circuit or the sum of channel leakage currents only for the entire electronic circuit. In order to estimate the leakage current of the electronic circuit, the processor 10 must first determine, for each state of each driven net-bounded partition 211a-215a in section 210a and 211x-215x in section 210x, a probability that the state will occur in the driven net-bounded partition during operation of the electronic circuit and the leakage current of the driven net-bounded partition in that state.

The probability that a particular state will occur in a particular driven net-bounded partition (i.e., that a given combination of voltage values will occur at the driven net-bounded partitions external connections) during operation of the electronic circuit can be determined by the processor 10 using known simulation or probabilistic analysis techniques. For example, this probability can be determined based on model of the electronic circuit, on a logic simulation of the electronic circuit, on a symbolic simulation of the electronic circuit, on a local topology-based probability estimation, etc. Logic simulation of the circuit will generally give the best estimate of leakage state probabilities at reasonable cost. Symbolic simulation (propagating logical functions, e.g., as BDDs, rather than values) can give better coverage, but may have problems with storage required for the logical function representations. The resulting logical function for each driven net-bounded partition leakage state would be probabilistically evaluated to get an estimated probability. Local topology-based probability estimation (e.g., by assuming all local inputs to a driven net-bounded partition are independent and analyzing state probabilities on that basis), can give relatively quick estimates, but is less accurate.

The leakage current for each state of each driven net-bounded partition can be determined by the processor 10 using leakage current modeling techniques. That is, the leakage for a given state of a driven net-bounded partition can be computed with transistor models that accurately model leakage. It should be understood that driven net-bounded partitions containing stacked devices are non-linear systems problems that require the use of an iterative solution method. This can be accomplished by solving for all internal node voltages and arc currents in each of independent states of the driven net-bounded partitions, using either industry standard device models that include rough leakage modeling, or more accurate custom transistor leakage models. Since leakage can be extremely variable across a chip, this leakage state characterization is preferably done by a method that accounts for the statistical distribution of the transistor characteristics, e.g., a Monte Carlo simulation. Such characterization may also produce a leakage distribution rather than a single leakage number.

More specifically, depending upon the embodiment, the "leakage current" of the driven net-bounded partition can comprise either gate and channel leakage current combined or channel leakage current only.

A driven net-bounded partition can leak only when at least two of its external connections are at different voltages (i.e., when at least one external connection is driven high and at least one other external connection is driven low).

In the case where the leakage current of a driven net-bounded partition is to comprise both gate and channel leakage current, the analyzer 9 will identify all possible states of each driven net-bounded partition by identifying, for each specific driven net-bounded partition, a all external connections to the driven net-bounded partition, and a total number n of non-tied external connections to the driven net-bounded partition (i.e., external connections that are not positive or negative supply connections, or that are not otherwise constrained to always be in the same state). If none of the external connections is tied (i.e., if no external connection is positive or negative supply connections, or is otherwise constrained to always be in the same state), then there are $2^N$ states that the driven net-bounded partition can be in, and $2^n-2$ states in which it can leak (since in one state all external connections are high and in another all are low). If all of the tied external connections are tied to the same one of the negative supply voltage ($V_{SS}$) and the positive supply voltage ($V_{DD}$), then there are $2^n-1$ states of the specific driven net-bounded partition that can leak. Finally, if at least one of the external connections is tied to the negative supply voltage ($V_{SS}$) and at least one other of the external connections is tied to the positive supply voltage ($V_{DD}$), then there are $2^n$ states of the specific driven net-bounded partition that can leak.

It should also be noted that even if only channel leakage is being determined and a device is on in a particular state, the entire driven net-bounded partition must still be considered in determining the leakage for that state (i.e., it can't be assumed that the intermediate node is at $V_{DD}-V_T$, because the cut off device is in a source follower configuration and this node will float higher than $V_{DD}-V_T$ over time). Additionally, the number of possible leakage states of a driven net-bounded partition may be reduced by considering logical constraints between the external connections. For example, in the case of an inverter, because the output node, which is always driven, separates the NFET and PFET, each transistor is a separate driven net-bounded partition with 3 external connections, of which 2 are non-tied, resulting in 3 ($=2^2-1$) leaking states for each of the single device driven net-bounded partitions. However, the two non-tied connections of each driven net-bounded partition (i.e., the inverter input and output nodes) must always be complementary, so the actual number of states for each driven net-bounded partition is only 2. Note that different instances of the same driven net-bounded partition (for example a single PFET transistor) may have different numbers of leakage states. The PFET of the inverter has 2 leakage states (as described above), but in a NAND gate it will have 3 and in a transmission gate it will have 6. Furthermore, because any static memory element includes at least one driven storage node, a driven net-bounded partition will not include static memory elements, or if it does, the storage node must be considered an external connection of the driven net-bounded partition.

By using driven net-bounded partitions to characterize leakage rather than CCC's, the resulting number of states for which leakage current is characterized is significantly reduced, without the loss of accuracy incurred by characterizing only individual transistors. For example, as mentioned above, FIG. 2 illustrates a single CCC 200, having multiple duplicate sections 210a . . . 210x, and each section is further partitioned into driven net-bounded partitions. If CCC 200 comprises 4 duplicate sections (i.e., if x=4), characterizing leakage current for the entire CCC 200 requires consideration of 1024 states, even when logical constraints between external connections are considered. Specifically, the CCC 200 has 2 independent external connections A and B associated with each duplicate section, plus an additional inputs S and ~S that are constrained to be complementary, and are constrained such that one and only one S signal of Sa . . . Sx may be high at any time (and therefore one and only one of ~Sa . . . ~Sx may be low at any time). Thus, the CCC 200 will have $N2^{2x}$ states. If there are a total of 4 duplicate sections, then the CCC 200 would have 1024 ($=4*2^2*^4$) states that must be characterized for leakage current. Contrarily, characterizing leakage current for each driven net-bounded partition within the CCC 200 only requires consideration of 128 states, even without considering logical constraints between external connections. Specifically, each section 210a-210x incorporates 5 driven net-bounded partitions (i.e., a total of 5× driven net-bounded partitions): one (215a . . . 215x) being a two-transistor partition with three non-tied external connections and $2^3=8$ characterization states, two (213a-213x and 214a-214x) being single transistor partitions with two non-tied external connections and $2^2=4$ characterization states, and two being (211a-211x and 212a-212x) being single transistor partitions with three external non-tied connections and $2^3=8$ characterization states. Thus, there are 32× states. If there are a total of 4 duplicate sections (i.e., if x=4), then the total number of states that must be considered in characterizing leakage current for the driven net-bounded partitions 211a-215a . . . 211x-215x is only 128. By considering logical constraints on external connections of the driven net-bounded partitions (e.g., by eliminating states in which the source and drain of an on device are at different voltages, as this produces a short circuit and cannot occur in properly designed circuits) the number of characterization states may be further reduced. For example, in partition 215a the state in which Aa is low and net 227a is also low produces a short circuit, and partition 214a has only three leakage states requiring characterization.

It should be noted that in the case where the leakage current of a driven net-bounded partition is to comprise channel leakage current only (i.e., where gate leakage current is negligible), the analyzer 9 will identify all possible states of each driven net-bounded partition by determining, for each specific driven net-bounded partition, a total number n of external gate connections and a number m of non-tied external channel connections. If a partition has no tied external connections, then there are $(2^n)(2^m-2)$ states of the specific driven net-bounded partition that can leak. If the partition has tied external connections connected only to a same one of the negative supply voltage ($V_{SS}$) and the positive supply voltage ($V_{DD}$), then there are $(2^n)(2^m-1)$ states of the specific driven net-bounded partition that can leak. Finally, if the partition has external tied connections to both the negative supply voltage ($V_{SS}$) and the positive supply voltage ($V_{DD}$), then there are $(2^n)(2^m)$ states of the specific driven net-bounded partition that can leak.

The number of possible states of a driven net-bounded partition with distinct leakage values may be further reduced by exploiting symmetries. Consider a driven net-bounded partition (e.g., an NFET pull-down network) with a single transistor in series with a collection of N equal-sized transistors in parallel (without the single transistor in series, each of the N parallel transistors would be a separate DNBP). If the gate signals are all independent, this driven net-bounded partition will have at least $2^{(N+1)}$ possible states (depending on whether the two end channel connections are tied or constrained). But the leakage of the collection will be determined by how many of the N parallel transistors have their gates high and how many have them low, and not by which particular transistors are in these states. Thus, the $2^{(N+1)}$ states can be reduced to 2*(N+1), where the 2 accounts for the different gate conditions of the single transistor, and the N+1 accounts for the fact that anywhere from 0 to N of the parallel transistors can be on.

After determining, for each state of each driven net-bounded partition, the leakage current of the driven net-bounded partition and the probability that the state will occur, the processor 10 can multiply these values together. That is, for each state of each driven net-bounded partition, the processor 10 can multiply the determined leakage current of the driven net-bounded partition times the determined probability that the state will occur. Finally, the processor 10 can aggregate (i.e., add together) all results of the multiplying process. The final sum will be equal to the estimated leakage current of the electronic circuit.

This final sum can be stored in a data storage device 11, 13 accessible by users for subsequent processing. Additionally or alternatively, this final sum can be output, for subsequent processing, to one or more additional processors within or external to the system 100 and/or to a user via a device 23 (e.g., in the form of a hard copy of a report printed on a printer or in the form of a soft copy of a report displayed on a display monitor). Subsequent processing can include, but is not limited to, redesigning the circuit layout to reduce the leakage current of the electronic circuit.

Optional functions that can be incorporated into the above-described analyzer 9 and/or processor 10 of the system 100 embodiments can include, but are not limited to, pre-computing or caching and reusing leakage values for different instances of the same driven net-bounded partition, creating a combined driven net-bounded partition from multiple driven net-bounded partitions, sub-dividing a large driven net-bounded partition into sub-partitions, and modeling leakage current in both steady and transient states.

Specifically, in the system 100 embodiments as described above and illustrated in FIG. 1, leakage current is separately and individually determined by the processor 10 for each state of each identified driven net-bounded partition. However, optionally, the processor 10 can, in some circumstances, pre-compute or cache and re-use leakage current values. That is, often times an electronic circuit will include multiple driven net-bounded partitions that are the same (e.g., as illustrated in FIG. 2, partition 211a is the same as 211x, partition 212a is the same as partition 212x, etc.) and, if this is the case, one determined leakage current values can be stored in memory 14, 16 or in data storage device 11, 13. Then, for an identically configured driven net-bounded partition, the previously determined leakage current values can be accessed and re-used by the processor 10. In other words, if a particular driven net-bounded partition occurs multiple times in a design, with the same values for non-logical parameters (e.g., voltage, temperature, process), each instance may have its own probability for each leakage state, but the leakage for those states can be computed once and reused. This can be done in several ways.

For example, each unique driven net-bounded partition in the design can be identified, and all of the leakage states for each driven net-bounded partition can be characterized (have their leakage computed). An advantage of this method is that, if all inputs and outputs of each cell from which the design constructed are driven nets, the characterization can be done on each cell, independent of the design in which the driven net-bounded partitions occur, and included in a cell characterization library. Alternatively, a determination of all driven net-bounded partition leakage state probabilities in the design can be made (e.g., through a logic simulation), and the leakage computation performed only for those driven net-bounded partition states which have non-zero probability. Leakage values would be cached to avoid re-computing the leakage for the same state in multiple instances of a driven net-bounded partition. An advantage of this method is that, if certain driven net-bounded partition states are never encountered, no leakage computation needs to be done for them. This might be particularly useful in a design containing driven net-bounded partitions with very large numbers of states. Alternatively, the probability of each leakage state may be summed over all instances of a driven net-bounded partition to produce an expected number of driven net-bounded partitions in the given leakage state at any time. Leakage can then be computed for each driven net-bounded partition leakage state with a non-zero expectation number, and multiplied by this expectation number to determine the total leakage contribution of the driven net-bounded partition state in all instances.

It should be noted that in determining whether or not to reuse previously determined leakage current values, a determination should be made as to whether or not narrow channel effects (NCE) were considered or ignored. Specifically, if narrow channel effects (NCE) are ignored, leakage values computed for states of a particular first driven net-bounded partition can be reused for any second driven net-bounded partition which is identical except for transistor channel widths, if all transistor channel widths in the second driven net-bounded partition are the same multiple X of the channel widths of the corresponding transistors in the first driven net-bounded partition. In this case the leakage for a leakage state of the second driven net-bounded partition is X times the leakage of the corresponding state in the first driven net-bounded partition. Note that if NCE is considered, leakage is not directly proportional to width. A device of a desired channel width may be created by creating a single physical transistor of that width, or by connecting in parallel (all gates connected together, all sources connected together, all drains connected together) a number of physical transistor with narrower channels, such that the sum of the physical transistor channel widths equals the desired channel width. Such parallel connected physical transistors are referred to as fingers. If a first driven net-bounded partition has a devices with a particular set of finger widths and all transistor channel widths in a second driven net-bounded partition are the same multiple X of the channel widths of the corresponding transistors in the first driven net-bounded partition, and all devices in the second driven net-bounded partition also have finger widths that are the same as those of the corresponding devices in the first driven net-bounded partition, leakage values from the first driven net-bounded partition may be multiplied by X for reuse with the second drive net-bounded partition, even if NCE is considered.

Additionally, in the system 100 embodiments as described above, driven net-bounded partition leakage current and state probability determinations are made by the processor 10 for each state of only the driven net-bounded partitions that are identified by the analyzer 9. However, optionally, after identifying the individual driven net-bounded partitions in the electronic circuit, the analyzer 9 can further create a single combined driven net-bounded partition (i.e., a super driven net-bounded partition) from multiple driven net-bounded partitions or can further sub-divide a single driven net-bounded partition into sub-partitions.

That is, the analyzer 9 can characterize two or more of identified driven net-bounded partitions as a single combined driven net-bounded partition (i.e., a super driven net-bounded partition) if/when the single combined driven net-bounded partition will require the characterization of no more leakage states than the total that would be required for the two or more driven net-bounded partitions separately (i.e., will require the characterization of no more leakage states than a sum of the numbers of leakage states that would be required to be analyzed for the two or more driven net-bounded partitions). In this case, the processor 10 will determine the leakage current of the combined driven net-bounded partition and the probability associated with each state of this combined driven net-bounded partition. It will then use this information to estimate the leakage current of the electronic circuit, rather than having to make separate leakage current/probability determinations for each state of each one of the multiple smaller driven net-bounded partitions. More specifically, if the total number of leakage characterization states of a possible combined driven net-bounded partition is less than or equal to the sum of the number of leakage characterization states of multiple driven net-bounded partitions, then the combined driven net-bounded partition can be used for purposes of estimating the overall leakage current of the electronic circuit.

Figure 3:
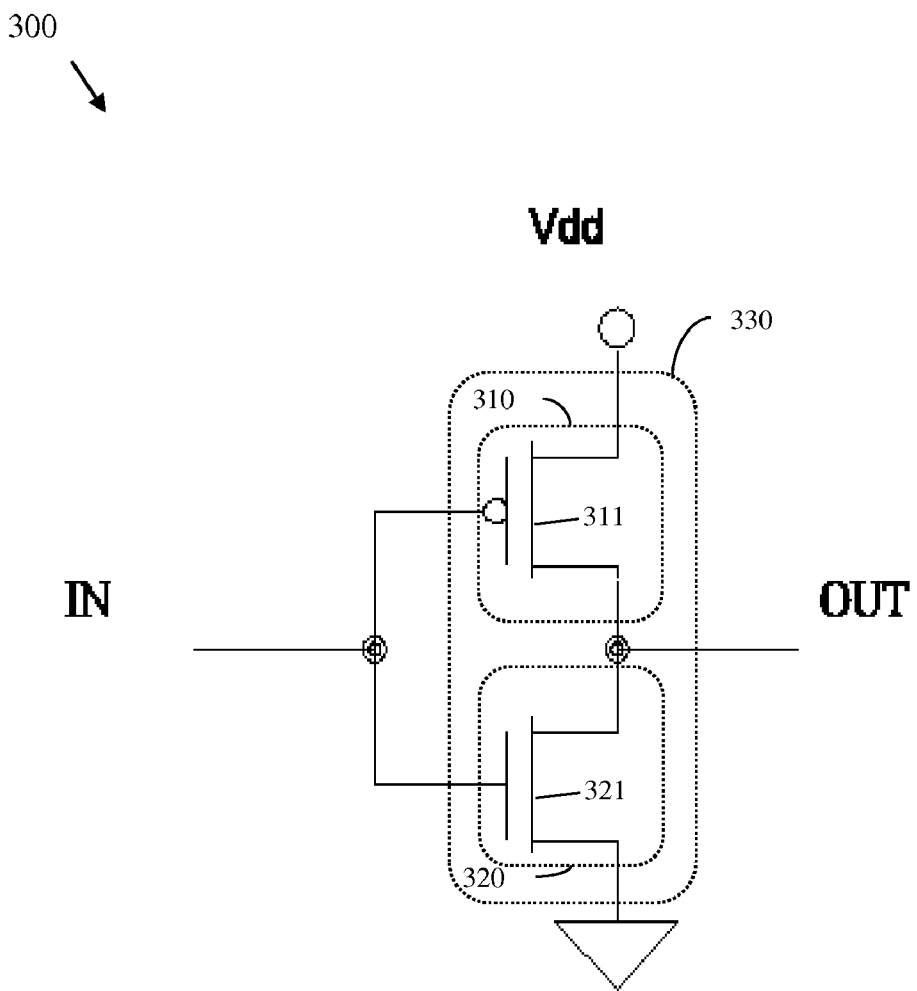
FIG. 3 is a schematic diagram illustrating a combined driven net-bounded partition incorporating multiple driven net-bounded partitions.

For example, referring to FIG. 3, consider an inverter 300 comprising a p-type field effect transistor (PFET) 311 and an n-type field effect transistor (NFET) 321. The PFET 311 and the NFET 321 each qualify as a discrete driven net-bounded partition 310, 320, respectively. Each of these driven net-bounded partitions 310, 320 has two possible states when the logical constraint that nets IN and OUT will always be at opposite values is taken into consideration. However, the inverter 300 itself also only has a total of two possible states. In such cases there may be some advantages in analyzing the larger "combined driven net-bounded partition" 330 made up of the smaller driven net-bounded partitions 310, 320.

It should be understood that, as with each individual driven net-bounded partition, combined driven net-bounded partitions should also not include static memory elements, or if they do, the storage node must be considered an external connection of the super driven net-bounded partition. It should further be understood that if logical constraints on the possible states of driven net-bounded partitions are used, one can be certain that the number of possible states of any single driven net-bounded partition will be no larger than the number of possible states for any super driven net-bounded partition containing it. So any set of x number of driven net-bounded partitions forming a super driven net-bounded partition with y number of possible states will, if analyzed separately rather than as a single combined driven net-bounded partition collectively have no more than x*y possible states. And there are still advantages to performing analysis on the lower level driven net-bounded partitions, as they are more likely to be reused, which may permit fewer leakage state characterizations, and because, since the driven net-bounded partition is smaller, the computational effort to analyze each leakage state will also be smaller.

The analyzer 9 can also, optionally, further divide a single driven net-bounded partition into multiple sub-partitions by splitting it at one or more cut nets. In this case, the processor 10 will determine the leakage current for that particular driven net-bounded partition in each given state by aggregating probable leakage currents determined for each of the sub-partitions in the given state, where, for each sub-partition, the probable leakage current is probabilistically weighted for either different possible combinations of voltages of the one or more cut nets or a range of possible voltage combinations of the one or more cut nets.

Figure 4:
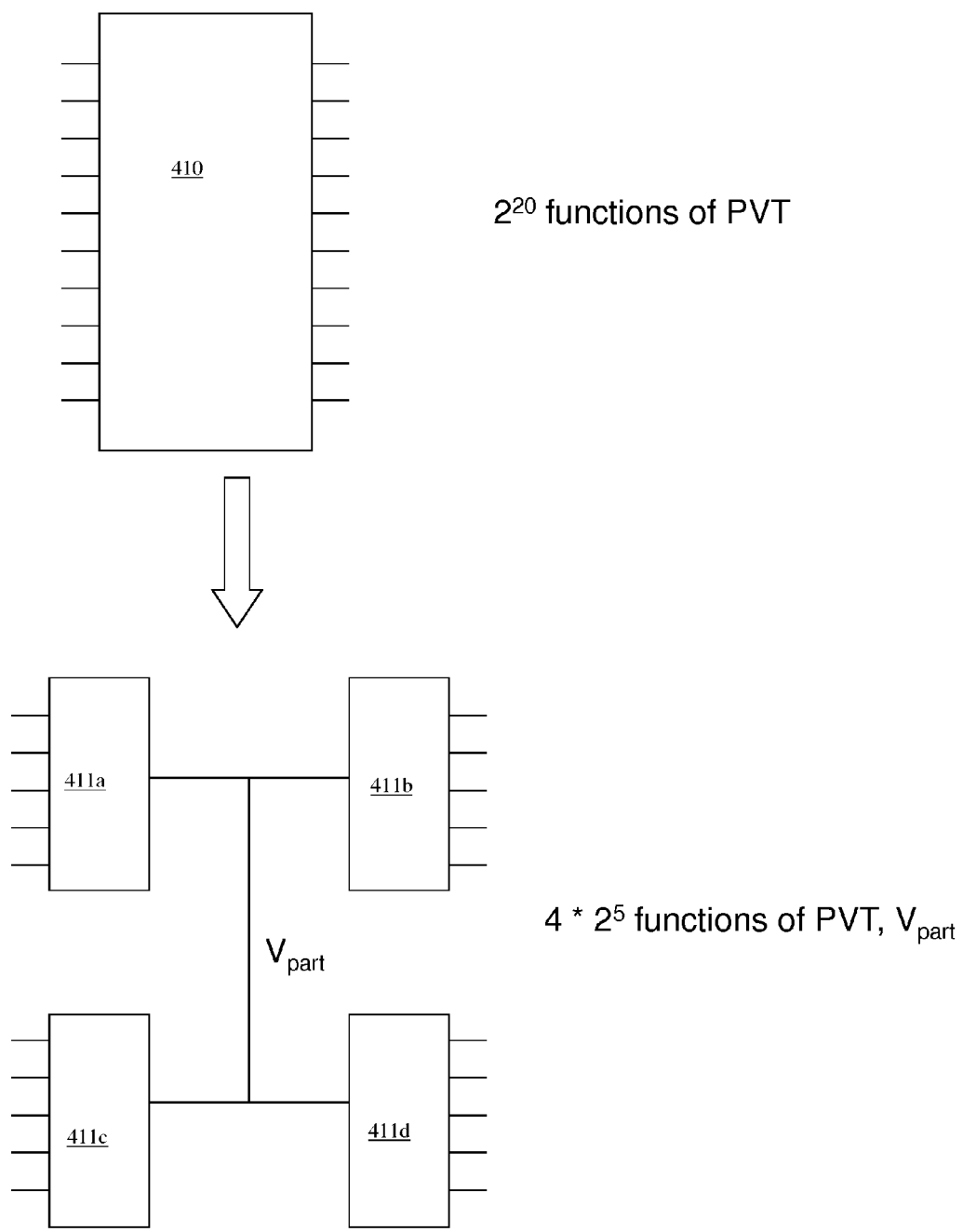
FIG. 4 is a schematic diagram illustrating a driven net-bounded partition further divided into sub-partitions.

Referring to FIG. 4, large driven net-bounded partitions (e.g., such as partition 410) may also be further divided into sub-partitions (e.g., such as sub-partitions 411a-d). This will be desirable if the number of possible distinct leakage states of the driven net-bounded partition 410 is too large even after logical constraints and symmetries are considered. Various criteria would be used to guide the process of dividing a driven net-bounded partition into sub-partitions. For example, each driven net-bounded partition 410 should be separated from the remainder of the driven net-bounded partitions by as few cut nets as possible. It is best if a single cut net can be identified whose removal partitions the circuit into acceptable sized partitions. Additionally, cut nets that are driven in at least some states are preferable because, for these states, the sub-partitions can be treated as real driven net-bounded partitions and can have their leakages computed separately. The partitioning process will preferentially be done so that each sub-partition 411a-d should have a limited number of possible states, and preferably as few possible states as possible. The sub-partitioning process will also preferentially be done so that the fewest unique sub-partitions are created in order to maximize the opportunity for caching or pre-computing and reusing the previously determined sub-partition leakage characterizations.

Once a driven net-bounded partition 410 is divided into sub-partitions 411a-d, the leakage currents associated with the states of each sub-partition 411a-d can be characterized in various ways. The leakage for a particular set of cut net voltages can be characterized for each possible state of the other (driven) external connections of the sub-partition. Since current will flow through the cut nets in these characterizations, the leakage of a particular combination of cut net voltages and driven external connections should be the maximum of the currents flowing into the external connections driven to the negative supply voltage ($V_{SS}$) and the current flowing from the external connections driven to the positive supply voltage ($V_{DD}$). In a first characterization method, the possible voltage range on the cut nets can be determined and the leakage currents associated with the sub-partition states can be computed at the extremes of the range. In this case, there will be $2^N$ combinations of such extremes for a sub-partition with N cut nets on its boundary and the leakage for each combination can be characterized for each possible state of the other (driven) external connections of the sub-partition. The maximum leakage value over all cut net voltage combinations will be retained as a pessimistic estimate of the state leakage for each state of the other (driven) external connections of the sub-partition. This simplifies the sub-partition analysis, but produces a conservative result. The possible voltage range of the cut nets may simply be assumed to be the full $V_{SS}$ to $V_{DD}$ range (most pessimistic) or may be determined by simulating an entire driven net-bounded partition state with a maximum impedance (most turned off devices) to $V_{SS}$ and a minimum impedance (most turned on devices) to $V_{DD}$ to find the maximum cut voltage, and the reverse to find the minimum cut voltage. These computed cut net voltage bounds may be determined across all states of the sub-partition or separately for each state of the sub-partition.

Alternatively, in a second characterization method, the leakage currents associated with a sub-partition's states can be computed as a function of the cut net voltages. These characterizations can then be combined, weighted by their leakage probability, to create an aggregate leakage model for the sub-partition as a function of cut net voltages. A circuit simulation or other iterative solution method can then be used to determine the actual cut net voltages and the leakage for the complete driven net-bounded partition. The advantage of this over complete driven net analysis is that different combinations of states for the different sub-partitions need not be considered, reducing the analysis complexity. It should be noted that the characterizations of sub-partition leakage across all states as a function of cut node voltage will in general not be reusable, even for reused driven net-bounded partitions, since the probabilities used to weight the different leakage states will differ between instances of the driven net-bounded partitions. One simple way of creating this aggregate leakage model across states is to simply connect together copies of all sub-partitions in all of their individual possible states, with the current from each weighted or scaled by that state's probability.

It should be noted that even though characterizing leakage current for sub-partitions requires simulations at different voltages or voltage ranges, dividing larger partitions into smaller sub-partitions may still require fewer simulations need to be performed. For example, referring again to FIG. 4, if the driven net-bounded partition 410 has 20 external connections, the number of states requiring consideration and, thereby, the number of simulations would be $2^{20}$ (i.e., 1,048,576). However, if this driven net-bounded partition 410 is further divided into identical sub-partitions each with 5 external connections partitioned into 4 identical sub-partitions, then the number of states requiring consideration is 4 times $2^5$ or 128. Even if each state is simulated at 100 different values of the voltage of cut net $V_{part}$, the total number of simulations required is 12,800, which is significantly less than that required for the entire driven net-bounded partition 410.

Figure 5:
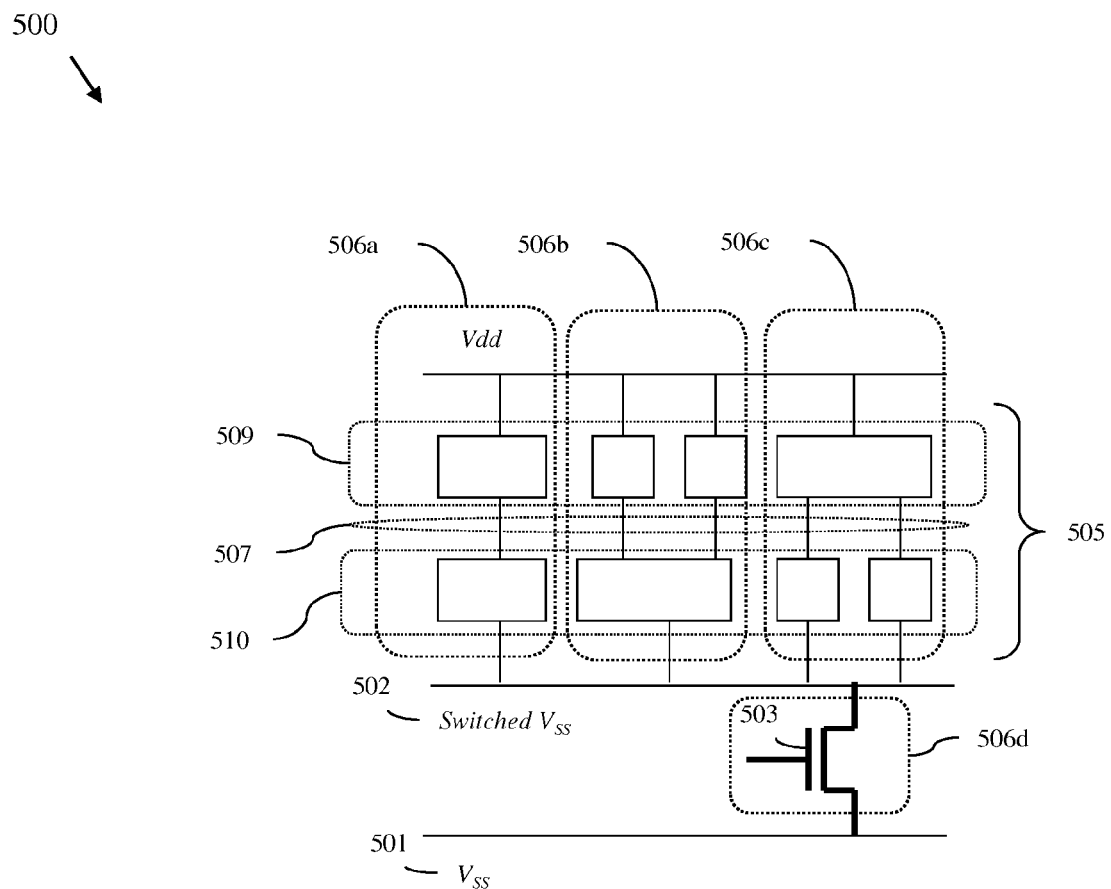
FIG. 5 is a schematic diagram illustrating a power gated macro as a driven net-bounded partition further divided into sub-partitions.

Referring to FIG. 5, a particular large driven net-bounded partition case of interest is that of a power gated macro 500. Assume the $V_{SS}$ connection of such a macro 500 is switched by connecting all gates 505 the macro to a virtual $V_{SS}$ 502 (i.e., switched $V_{SS}$), and connecting virtual $V_{SS}$ 502 to real $V_{SS}$ 501 with a series transistor 503 (e.g., a $V_{DD}$ switch can be handled in the same manner). In this case, the entire macro 500 becomes a single driven net-bounded partition, which will lead to an obvious state explosion. The obvious cut net here is the virtual $V_{SS}$ net 502 (i.e., the switched $V_{SS}$), as it will separate (at least) all of the gates 505 into separate sub-partitions (see sub-partitions 506a-506d) It is also driven to real $V_{SS}$ 501 when the macro 500 is turned on, allowing the macro 500 to be characterized like a normal (non-power-gated) macro for this condition, such that all gate output nets 507 can be treated as driven nets, further partitioning the pull-up portions 509 and pull-down portion 510 of gates 505 into separate sub-partitions and requiring special treatment only in the off state (i.e., when switched $V_{SS}$ 501 is not driven to the voltage of real $V_{SS}$ 501. In the power gating case, it can be advantageous to always treat the virtual $V_{SS}$ 502 as a driven net. The off state leakage is then determined by finding the state probabilities for the sub-partitions in the macro off state, which may be different than the probabilities in the macro on state because the inputs may be driven to particular values when off, and the second sub-partition leakage characterization method would be used in order to achieve the greatest reduction in the number of distinct states whose leakage must be iteratively computed, starting at a guessed off state virtual $V_{SS}$ voltage, and iteratively repeating until the macro leakage and the NFET power switch leakages are equal.

Finally, in the system 100 embodiments described above, the processor 10 can determine the leakage current for each state of each driven net-bounded partition using leakage current modeling techniques that consider the steady-states only of the external connections of the driven net-bounded partition. However, optionally, the leakage current of each driven net-bounded partition in each state can be determined by the processor 10 using leakage current modeling techniques that consider both the steady states and the transitioning states of the external connections of the driven net-bounded partition.

Specifically, the final steady-state leakage of a driven net-bounded partition will be determined only by its external connection states. However, different initial voltages on internal nodes within the driven net-bounded partition and the capacitance on those internal nodes may cause the leakage to start at a different value from the steady state and it may take quite a while to reach the steady state. Because driven net-bounded partitions may spend only brief times in a particular external connection state, it can be important to account for this transient difference in leakage.

To account for this transient difference in leakage, all possible initial internal state voltages of the driven net-bounded partition for each external connection state may be analyzed.

These initial state internal node voltages can be determined by considering all possible ways in which the internal node can be placed into a high impedance state. For example, the node between the NFETs in a NAND gate may be placed into a high impedance state by turning off the lower NFET last, in which case the node will initially be at $V_{SS}$, or by turning off the upper NFET last, in which case the node will initially be at $V_{DD}$-$V_T$, where $V_T$ is the threshold voltage of the upper NFET. A transient simulation can then be done starting at each of these initial states, retaining the internal node voltage and leakage values as a function of time, V(t) and I(t) (in the case of multiple internal nodes there will be a pair of these functions for each internal node). The simulation can stop when the leakage has reached a valued deemed sufficiently close to the steady state leakage value, and V(t) and I(t) will be considered to be infinitely extended in time with these steady state values.

If a particular driven net-bounded partition is in a given leakage state for a given amount of time $t_{leak}$, starting from a particular initial state, the total charge leaked during that time will be the integral of I(t) for that initial state from t=0 to $t_{leak}$.

For a driven net-bounded partition with one internal node (or which can have at most one un-driven internal node for any external connection state), at most two transient simulations are required, starting with the internal node voltage at the extremes of its possible values. This is possible since any leakage behavior starting at an intermediate value will be a subset of one of these simulations. For example, if the steady state internal node voltage is 0.5, its state 1 initial voltage is 0.8, and its state 2 initial voltage is 0.7, the state 1 approach to steady state will have to pass through state 2, and hence the state 2 simulation will be a subset of that for state 1. The internal node min and max voltages can be assumed to range from $V_{SS}$ to $V_{DD}$, can be determined using min/max impedance paths to $V_{SS}$/$V_{DD}$ as described above in driven net-bounded partition sub-partitioning, or can be determined as the min and max of all initial state voltages on the internal node. If a driven net-bounded partition with a single internal node is in a given leakage state for a given amount of time $t_{leak}$, and starting from a particular initial state where the single internal voltage is at $V_{init}$, the total charge leaked during that time will be $$\int_{t_0}^{t_0+t_{leak}} I(t)dt$$

where $V(t_0)=V_{init}$.

The impact on leakage of the history effect in silicon on insulator (SOI) gates can be handled in the same manner as above, where the floating body voltage(s) of the various devices are treated in the same manner as the internal node voltages above. Since, in general, the initial state of the body node will unknown, the leakage estimate can use a worst case initial value for the body voltage or some average value.

Figure 6:
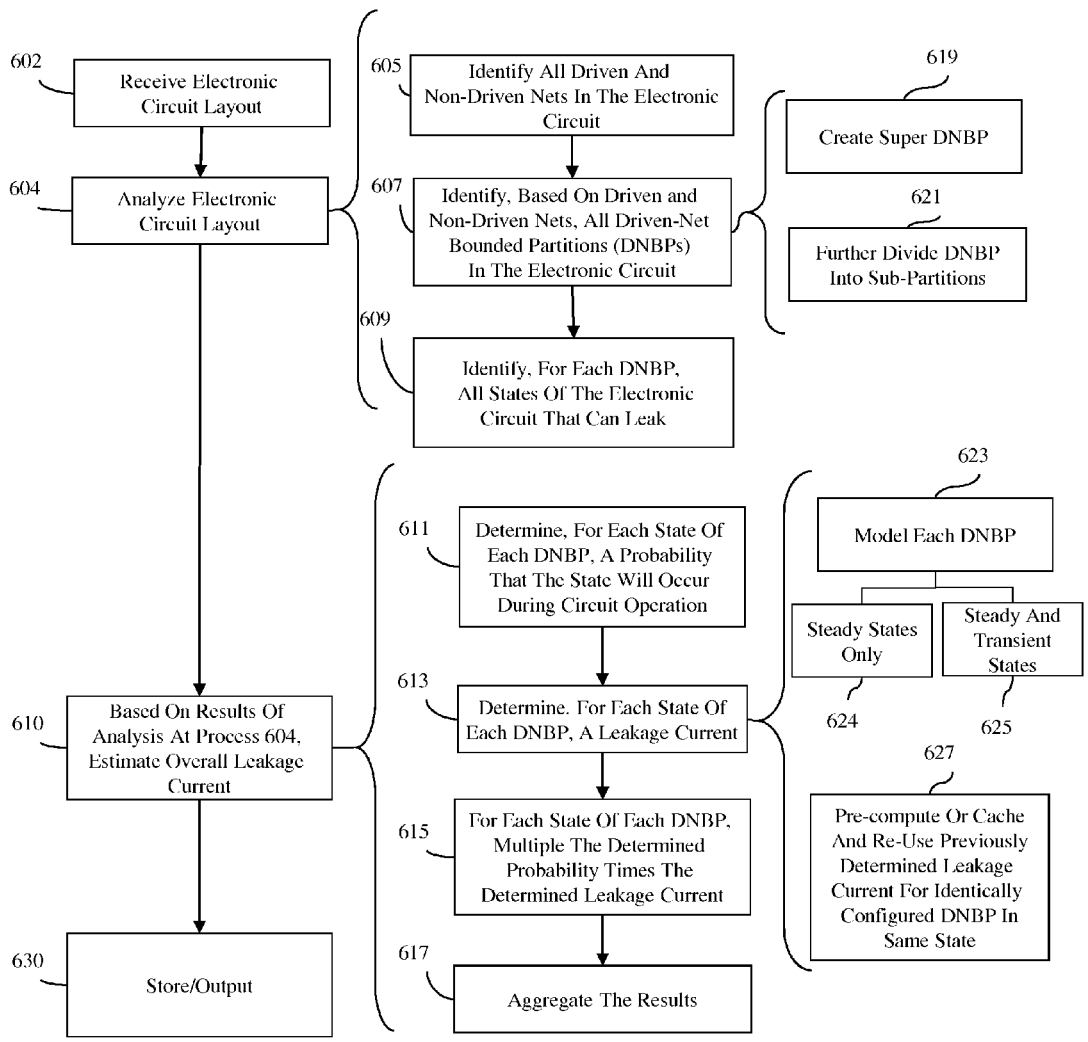
FIG. 6 is a flow diagram illustrating embodiments of a method for estimating overall leakage current of an electronic circuit.

Referring to FIG. 6 in combination with FIG. 1, also disclosed herein are embodiments of an associated method for estimating the overall leakage current of an electronic circuit. The method embodiments can comprise receiving and analyzing, e.g., by a circuit layout analyzer 9, the layout of the electronic circuit design (602-604). Specifically, this analyzing process 604 can comprise analyzing the layout of an electronic circuit in order to: (1) identify all driven and non-driven nets within the electronic circuit (605); (2) identify, based on the driven and non-driven nets, all driven net-bounded partitions within the electronic circuit (607); and (3) identify, for each driven net-bounded partition, all states of the electronic circuit that can leak (609).

Specifically, at process 605, the nets in the electronic circuit can be identified and the driven nets can be distinguish from non-driven nets, driven nets being any net that is fully driven to a supply voltage (i.e., the negative supply voltage ($V_{SS}$) or the positive supply voltage ($V_{DD}$)), with no threshold voltage drop, in all states of the electronic circuit. Thus, for a net to be driven, either a path to the negative supply voltage ($V_{SS}$) exist through the channel connections of n-type field effect transistors (NFETs) that are all turned on (have high gate voltages) or a path to the positive supply voltage ($V_{DD}$) exist through the channel connections of p-type field effect transistors (PFETs) that are all turned on (have low gate voltages) in all states of the circuit. See the detailed discussion above regarding identification of the driven nets 227a, 227x and 228 and non-driven nets 229a and 229x in the electronic circuit illustrated in FIG. 2.

Determining the driven net-bounded partitions at process 607, given these identified driven and non-driven nets, is then relatively simple. Specifically, the driven net-bounded partitions in the electronic circuit can be identified as any set of one or more of the multiple devices in the electronic circuit, where the set is configured such that all external connections of the set are among the driven nets and further such that an interconnection between any pair of devices in the set comprises non-driven nets (i.e., at least one non-driven net) and no driven nets. See detailed discussion above regarding identification of the partitions 211a-215a and 211x-215x in the electronic circuit illustrated in FIG. 2. It should be noted that multiple transistors are in the same driven net-bounded partition, if there is an interconnection between them that does not include a driven net (e.g., see NFETs 225a-226a which form driven net-bounded partition 215a and NFETs 225x-226x which form driven net-bounded partition 215x). All of the other driven net-bounded partitions illustrated in FIG. 2 include only a single transistor (e.g., see driven net-bounded partition 211a-214a in section 210a and 211x-214x in section 210x). The driven net-bounded partitions in the illustrative example of FIG. 2 each comprises only NFETs (215a, 211a, 215x, and 211x) or only PFETs (212a, 213a, 214a, 212x, 213x, and 214x), but driven net-bounded partitions may in practice comprise any mix of NFETs and PFETs. Additionally, as discussed in detail above with regard to the system 100 embodiments and as illustrated in FIG. 2, at least one of these driven net-bounded partitions (e.g., 215a, 215x) in the electronic circuit can comprise multiple field effect transistors (e.g., 225a-226a, 225x-226x) that are not configured as a complete logic gate.

As mentioned above, after identifying all of the driven net-bounded partitions, the analyzing process 604 can further comprise analyzing the layout of the electronic circuit in order to identify, for each driven net-bounded partition, all possible states of the electronic circuit that can leak (609). Specifically, all possible combinations of voltage values at the driven net-bounded partition's external connections are determined. This can be accomplished using leakage current modeling techniques. That is, the leakage for a given state of a driven net-bounded partition can be computed with transistor models that accurately model leakage. It should be understood that driven net-bounded partitions containing stacked devices are non-linear systems problems that require the use of an iterative solution method. This can be accomplished by solving for all internal node voltages and arc currents in each of independent states of the driven net-bounded partitions, using either industry standard device models that include rough leakage modeling, or more accurate custom transistor leakage models. Since leakage can be extremely variable across a chip, this leakage state characterization is preferably done by a method that accounts for the statistical distribution of the transistor characteristics, e.g., a Monte Carlo simulation. Such characterization may also produce a leakage distribution rather than a single leakage number.

Next, the method embodiments can comprise estimating, e.g., by a processor 10 in communication with the circuit layout analyzer 9 and based on the results of the analysis process 604, the leakage current of the electronic circuit (610). Depending upon the embodiment, this estimated "leakage current" of the electronic circuit can comprise either the sum of gate and channel leakage currents for the entire electronic circuit or the sum of channel leakage currents only for the entire electronic circuit.

Specifically, this estimating process can comprise first determining, for each state of each driven net-bounded partition, a probability that the state will occur in the driven net-bounded partition during operation of the electronic circuit and also a leakage current associated with that state in that driven net-bounded partition (611-613).

The probability that a particular state will occur in a particular driven net-bounded partition (i.e., that a given combination of voltage values will occur at the driven net-bounded partitions external connections) during operation of the electronic circuit can be determined at process 611 using known simulation or probabilistic analysis techniques. For example, this probability can be determined based on model of the electronic circuit, on a logic simulation of the electronic circuit, on a symbolic simulation of the electronic circuit, on a local topology-based probability estimation, etc. Logic simulation of the circuit will generally give the best estimate of leakage state probabilities at reasonable cost. Symbolic simulation (propagating functions, e.g., as BDDs, rather than values) can give better coverage, but may have problems with storage required for the functional representations. The resulting function for each driven net-bounded partition leakage state would be probabilistically evaluated to get an estimated probability. Local topology-based probability estimation (e.g., assume all local inputs to a driven net-bounded partition are independent and analyze state probabilities on that basis), can give relatively quick estimates, but is less accurate.

The leakage current for each state of each driven net-bounded partition can be determined at process 613 using leakage current modeling techniques. That is, the leakage for a given state of a driven net-bounded partition can be computed with transistor models that accurately model leakage. It should be understood that driven net-bounded partitions containing stacked devices are non-linear systems problems that require the use of an iterative solution method. This can be accomplished by solving for all internal node voltages and arc currents in each of independent states of the driven net-bounded partitions, using either industry standard device models that include rough leakage modeling, or more accurate custom transistor leakage models. Since leakage can be extremely variable across a chip, this leakage state characterization is preferably done by a method that accounts for the statistical distribution of the transistor characteristics, e.g., a Monte Carlo simulation. Such characterization may also produce a leakage distribution rather than a single leakage number.

More specifically, depending upon the embodiment, the "leakage current" of a driven net-bounded partition can comprise either gate and channel leakage current or channel leakage current only. It should be noted that in the case where the determined leakage current of a driven net-bounded partition comprises both gate and channel leakage current, the process 609 of identifying all possible states of each driven net-bounded partition will comprise determining, for each specific driven net-bounded partition, a total number n of external connections to the driven net-bounded partition. Then, if none of the external connections is tied, then there are approximately $2^n-2$ states of the specific driven net-bounded partition that can leak. If all of the external connections are tied to a same one of the negative supply voltage ($V_{SS}$) and the positive supply voltage ($V_{DD}$), then there are approximately $2^n-1$ states of the specific driven net-bounded partition that can leak. Finally, if at least one of the external connections is tied to the negative supply voltage ($V_{SS}$) and at least one other of the external connections is tied to the positive supply voltage ($V_{DD}$), then there are approximately $2^n$ states of the specific driven net-bounded partition that can leak.

However, in the case where the determined leakage current of a driven net-bounded partition comprises channel leakage current only (i.e., where gate leakage current is negligible), the process 609 of identifying all possible states of each driven net-bounded partition will comprise determining, for each specific driven net-bounded partition, a total number n of external gate connections to the driven net-bounded partition and a number m of non-tied external channel connections. Then, if none of the external connections is tied, then there are approximately $(2^n)(2^m-2)$ states of the specific driven net-bounded partition that can leak. If all of the external connections are tied to a same one of the negative supply voltage ($V_{SS}$) and the positive supply voltage ($V_{DD}$), then there are approximately $(2^n)(2^m-1)$ states of the specific driven net-bounded partition that can leak. Finally, if at least one of the external connections is tied to the negative supply voltage ($V_{SS}$) and at least one other of the external connections is tied to the positive supply voltage ($V_{DD}$), then there are approximately $(2^n)(2^m)$ states of the specific driven net-bounded partition that can leak.

Next, the estimating process 610 can comprise multiplying, for each state of each driven net-bounded partition, the determined leakage current times the determined probability (615) and, then, aggregating (i.e., adding together) all results of the multiplying process such that the final sum is the estimated overall leakage current for the electronic circuit (617).

This final sum can be stored and made accessible by users for subsequent processing. Additionally or alternatively, this final sum can be output for subsequent processing, (e.g., in the form of a hard copy of a report printed on a printer or in the form of a soft copy of a report displayed on a display monitor) (630). Subsequent processing can include, but is not limited to, redesigning the circuit layout to reduce the leakage current of the electronic circuit.

Various optional method steps that may be incorporated into the above-described method embodiments include, but are not limited to, pre-computing or caching and reusing leakage values for different instances of the same driven net-bounded partition (627), creating a combined driven net-bounded partition from multiple driven net-bounded partitions (619), sub-dividing a large driven net-bounded partition into sub-partitions (621), and modeling leakage current in both steady and transient states (625).

Specifically, the leakage current of each identified driven net-bounded partition can, at process 613, be separately and individually determined, as described above, using known leakage current modeling techniques (623). However, optionally, the leakage current of a given driven net-bounded partition in a given state can be determined at process 613 simply by reusing a previously determined leakage current for an identically configured driven net-bounded partition in the same state, rather than by modeling (625). Leakage values computed for states of a particular first driven net-bounded partition can also be reused for a second driven net-bounded partition which is identical except for transistor channel widths, if all transistor channel widths in the second driven net-bounded partition are the same multiple X of the channel widths of the corresponding transistors in the first driven net-bounded partition. In this case the leakage for a leakage state of the second driven net-bounded partition is X times the leakage of the corresponding state in the first driven net-bounded partition. This feature of the invention is discussed in detail above with regard to the system 100 embodiment.

Additionally, the driven net-bounded partition leakage current and state probability determinations are generally made at processes 611-613 for each state of each of the driven net-bounded partitions identified at processes 607-609. However, optionally, after identifying the individual driven net-bounded partitions in the electronic circuit at process 607, the method embodiments can comprise creating a single combined driven net-bounded partition (i.e., a super driven net-bounded partition) from multiple driven net-bounded partitions (619) or further sub-dividing a single driven net-bounded partition into sub-partitions (621).

For example, after identifying the individual driven net-bounded partitions in the electronic circuit at process 607, two or more of these driven net-bounded partitions can be characterized, e.g., by the circuit layout analyzer, as a single combined driven net-bounded partition (i.e., a super driven net-bounded partition) if/when the single combined driven net-bounded partition will require the characterization of no more leakage states than the total that would be required for the two or more driven net-bounded partitions separately (619). In this case the leakage current and probability associated with each state of this single combined driven net-bounded partition will be determined at processes 611-613 and used to estimate the leakage current of the electronic circuit at process 610, rather than having to make separate leakage current/probability determinations for each state of each one of the two or more driven net-bounded partitions. This feature of the invention is discussed in detail above with regard to the system 100 embodiment.

Also, optionally, after identifying the individual driven net-bounded partitions in the electronic circuit at process 607, at least one particular driven net-bounded partition can be sub-divided into multiple sub-partitions (621). In this case, the leakage current for that particular driven net-bounded partition in each given state will be determined by aggregating probable leakage currents determined for each of the sub-partitions in the given state, where, for each sub-partition, the probable leakage current is probabilistically weighted for either different possible voltages or a range of possible voltages. This feature of the invention is discussed in detail above with regard to the system 100 embodiment.

Finally, in the method embodiments described above, the leakage current of a driven net-bounded partition in a particular state can be determined at process 613 using leakage current modeling techniques that consider the steady-states only of the external connections of the driven net-bounded partition (624). However, optionally, the leakage current of a driven net-bounded partition in a particular state can be determined at process 613 using leakage current modeling techniques that consider both the steady states and the transitioning states of the external connections of the driven net-bounded partition (625). This feature of the invention is discussed in detail above with regard to the system 100 embodiment.

Also disclosed herein are embodiments of a computer program product comprising a storage medium readable by a computer and having computer usable program code embodied thereon. The computer useable program code is executable by the computer to perform the above-described method of estimating the overall leakage current of an electronic circuit.

Specifically, the embodiments of the invention can take the form of an entirely hardware embodiment, an entirely software embodiment or an embodiment including both hardware and software elements. In one embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a system and of an associated method for accurately and economically estimating the leakage current of an electronic circuit. The embodiments identify all driven and non-driven nets within the electronic circuit, all driven net-bounded partitions determined by these driven and non-driven nets, and all possible states that can leak for all of the driven net-bounded partitions. Then, using this information, the embodiments estimate the leakage current of the electronic circuit. This is accomplished by first determining, for each state of each driven net-bounded partition, a leakage current of the driven net-bounded partition and a probability that the state will occur in the driven net-bounded partition during operation of the electronic circuit. Then, for each state of each driven net-bounded partition, the leakage current of the driven net-bounded partition and the state probability are multiplied together. The results are then aggregated. The final sum is equal to the estimated leakage current for the electronic circuit.

The resulting electronic circuit leakage current estimation is accurate because the leakage current values of different driven net-bounded partitions are dependent only on the driven values at their boundaries and don't interact. Furthermore, this technique is more economical than prior art methods because the number of external connections to a driven net-bounded partition may be much smaller than the number of external connections to a channel connected component (CCC). A smaller number of external connections translates into a smaller number of states requiring characterization and, thus, reduces costs. The method also provides an improvement in accuracy over simple characterization of individual devices without consideration of voltages of non-driven nets between devices. Other benefits of the method are the abilities to analyze partitions are not entire gates, to analyze partitions that are not entire pull-up or pull-down networks of a complementary logic gate, and to analyze partitions that comprise combinations of NFETs and PFETs.

What is claimed is:

1. A system for determining leakage current of an electronic circuit comprising multiple devices interconnected by multiple nets, said multiple nets comprising driven nets and non-driven nets, said system comprising:
an analyzer analyzing a layout of said electronic circuit in order to: identify said driven nets and said non-driven nets of said electronic circuit; identify all driven net-bounded partitions of said electronic circuit, based on said driven nets and said non-driven nets; and identify all possible states that can leak for all of said driven net-bounded partitions,
wherein said driven nets comprise any of said nets that are driven to a supply voltage, with no threshold voltage drop, in all states of said electronic circuit,
wherein each driven net-bounded partition comprises a set of said devices, wherein said devices are in a same driven net-bounded partition, if there is an interconnection between them that does not include a driven net, and
wherein at least one of said driven net-bounded partitions comprises multiple field effect transistors that are not configured as a complete logic gate; and
a processor in communication with said analyzer and estimating said leakage current of said electronic circuit by performing the following:
determining, for each state of each driven net-bounded partition, a leakage current of said driven net-bounded partition and a probability that said state of said driven net-bounded partition will occur during operation of said electronic circuit;
multiplying, for each state of each driven net-bounded partition, said leakage current of said driven net-bounded partition by said probability; and
aggregating all results of said multiplying.

2. The system of claim 1, wherein at least one of said driven nets, in said all states of said electronic circuit, is driven to a negative supply voltage ($V_{SS}$) through a driven-net path comprising only nets and n-type field effect transistors, or is driven to a positive supply voltage ($V_{DD}$) through a driven-net path comprising only nets and p-type field effect transistors.

3. The system of claim 1, said processor determining said leakage current of said driven net-bounded partition based on leakage current modeling when said external connections of said driven net-bounded partition are in steady-states only.

4. The system of claim 1, said processor determining said leakage current of said driven net-bounded partition based on leakage current modeling when said external connections of said driven net-bounded partition are in steady-states and also when said external connections of said driven net-bounded partition are transitioning between said steady-states.

5. The system of claim 1, wherein said analyzer further sub-divides at least one driven net-bounded partition into multiple sub-partitions and wherein said processor further determines said leakage current of said at least one driven net-bounded partition in a given state of said at least one driven net-bounded partition by aggregating probable leakage currents determined for each of said sub-partitions in said given state, where, for each sub-partition, said probable leakage current is probabilistically weighted for one of different possible voltages and a range of possible voltages.

6. The system of claim 1, said analyzer further characterizing at least two driven net-bounded partitions as a single combined driven net-bounded partition when said single combined driven net-bounded partition will require characterization of no more leakage states than a sum of the numbers of leakage states that would be required to be analyzed for two or more driven net-bounded partitions.

7. The system of claim 1, said processor determining said probability based on at least one of: a model of said electronic circuit; a logic simulation of said electronic circuit; a symbolic simulation of said electronic circuit; and a local topology-based probability estimation.

8. The system of claim 1, said processor determining said leakage current of said driven net-bounded partition by reusing any previously determined leakage currents for any identically configured driven net-bounded partitions.

9. A method of estimating leakage current of an electronic circuit comprising multiple devices interconnected by multiple nets, said multiple nets comprising driven nets and non-driven nets, said method comprising:
analyzing, by an analyzer, a layout of said electronic circuit in order to: identify said driven nets and said non-driven nets of said electronic circuit; identify all driven net-bounded partitions of said electronic circuit, based on said driven nets and said non-driven nets; and identify all possible states that can leak for all of said driven net-bounded partitions, wherein said driven nets comprise any of said nets that are driven to a supply voltage, with no threshold voltage drop, in all states of said electronic circuit, wherein each driven net-bounded partition comprises a set of said devices, wherein said devices are in a same driven net-bounded partition, if there is an interconnection between them that does not include a driven net, and wherein at least one of said driven net-bounded partitions comprises multiple field effect transistors that are not configured as a complete logic gate; and estimating, by a processor in communication with said analyzer, a leakage current for said electronic circuit, said estimating comprising:

determining, for each state of each driven net-bounded partition, a leakage current of said driven net-bounded partition and a probability that said state will occur during operation of said electronic circuit;

multiplying, for each state of each driven net-bounded partition, said leakage current of said driven net-bounded partition by said probability; and aggregating all results of said multiplying.

10. The method of claim 9, wherein at least one of said driven nets, in said all states of said electronic circuit, is driven to a negative supply voltage ($V_{SS}$) through a driven-net path comprising only nets and n-type field effect transistors, or is driven to a positive supply voltage ($V_{DD}$) through a driven-net path comprising only nets and p-type field effect transistors.

11. The method of claim 9, said determining of said leakage current of said driven net-bounded partition being based on leakage current modeling when said external connections of said driven net-bounded partition are in steady-states only.

12. The method of claim 9, said determining of said leakage current of said driven net-bounded partition being based on leakage current modeling when said external connections of said driven net-bounded partition are in steady-states and also when said external connections are transitioning between said steady-states.

13. The method of claim 9, further comprising:

sub-dividing, by said analyzer, at least one driven net-bounded partition into multiple sub-partitions; and, determining, by said processor, a leakage current of said at least one driven net-bounded partition in a given state by aggregating probable leakage currents determined for each of said sub-partitions in said given state, where, for each sub-partition, said probable leakage current is probabilistically weighted for one of different possible voltages and a range of possible voltages.

14. The method of claim 9, further comprising characterizing, by said analyzer, at least two driven net-bounded partitions as a single combined driven net-bounded partition when said single combined driven net-bounded partition will require characterization of no more leakage states than a sum of the numbers of leakage states that would be required to be analyzed for two or more driven net-bounded partitions.

15. The method of claim 9, said determining of said probability being based on at least one of: a model of said electronic circuit; a logic simulation of said electronic circuit; a symbolic simulation of said electronic circuit; and a local topology-based probability estimation.

16. A method of estimating leakage current of an electronic circuit comprising multiple devices interconnected by multiple nets, said multiple nets comprising driven nets and non-driven nets, said method comprising:

analyzing, by an analyzer, a layout of said electronic circuit in order to: identify said driven nets and said non-driven nets of said electronic circuit; identify all driven net-bounded partitions of said electronic circuit, based on said driven nets and said non-driven nets; and identify all possible states that can leak for all of said driven net-bounded partitions, wherein said driven nets comprise any of said nets that are driven to a supply voltage, with no threshold voltage drop, in all states of said electronic circuit, wherein each driven net-bounded partition comprises a set of said devices, wherein said devices are in a same driven net-bounded partition, if there is an interconnection between them that does not include a driven net, and wherein at least one of said driven net-bounded partitions comprises multiple field effect transistors that are not configured as a complete logic gate; and estimating, by a processor in communication with said analyzer, a leakage current for said electronic circuit, said estimating comprising:

determining, for each state of each driven net-bounded partition, a leakage current of said driven net-bounded partition and a probability that said state will occur during operation of said electronic circuit, wherein said determining of said leakage current of said driven net-bounded partition comprises reusing any previously determined leakage currents for any identically configured driven net-bounded partitions;

multiplying, for each state of each driven net-bounded partition, said leakage current of said driven net-bounded partition by said probability; and aggregating all results of said multiplying.

17. The method of claim 16, wherein at least one of said driven nets, in said all states of said electronic circuit, is driven to a negative supply voltage ($V_{SS}$) through a driven-net path comprising only nets and n-type field effect transistors, or is driven to a positive supply voltage ($V_{DD}$) through a driven-net path comprising only nets and p-type field effect transistors.

18. The method of claim 16, said determining of said leakage current of said driven net-bounded partition being based on leakage current modeling when said external connections of said driven net-bounded partition are in steady-states only.

19. The method of claim 16, said determining of said leakage current of said driven net-bounded partition being based on leakage current modeling when said external connections of said driven net-bounded partition are in steady-states and also when said external connections are transitioning between said steady-states.

20. The method of claim 16, further comprising:

sub-dividing, by said analyzer, at least one driven net-bounded partition into multiple sub-partitions; and, determining, by said processor, a leakage current of said at least one driven net-bounded partition in a given state by aggregating probable leakage currents determined for each of said sub-partitions in said given state, where, for each sub-partition, said probable leakage current is probabilistically weighted for one of different possible voltages and a range of possible voltages.

21. The method of claim 16, further comprising characterizing, by said analyzer, at least two driven net-bounded partitions as a single combined driven net-bounded partition when said single combined driven net-bounded partition will require characterization of no more leakage states than a sum of the numbers of leakage states that would be required to be analyzed for two or more driven net-bounded partitions.

22. A computer program product comprising a storage medium readable by a computer and having computer usable program code embodied thereon, said computer useable program code executable by said computer for performing a method of estimating leakage current of an electronic circuit comprising multiple devices interconnected by multiple nets, said multiple nets comprising driven nets and non-driven nets, said method comprising:

analyzing a layout of said electronic circuit in order to: identify said driven nets and said non-driven nets of said electronic circuit; identify all driven net-bounded partitions of said electronic circuit, based on said driven nets and said non-driven nets; and identify all possible states that can leak for all of said driven net-bounded partitions, wherein said driven nets comprise any of said nets that are driven to a supply voltage, with no threshold voltage drop, in all states of said electronic circuit, wherein each driven net-bounded partition comprises a set of said devices, wherein said devices are in a same driven net-bounded partition, if there is an interconnection between them that does not include a driven net, and wherein at least one of said driven net-bounded partitions comprises multiple field effect transistors that are not configured as a complete logic gate; and estimating a leakage current for said electronic circuit, said estimating comprising:

determining, for each state of each driven net-bounded partition, a leakage current of said driven net-bounded partition and a probability that said state will occur during operation of said electronic circuit;

multiplying, for each state of each driven net-bounded partition, said leakage current of said driven net-bounded partition by said probability; and aggregating all results of said multiplying.

* * * * *